United States Patent
Li et al.

(10) Patent No.: US 10,741,702 B2
(45) Date of Patent: Aug. 11, 2020

(54) THIN-FILM VARIABLE METAL-OXIDE-SEMICONDUCTOR (MOS) CAPACITOR FOR PASSIVE-ON-GLASS (POG) TUNABLE CAPACITOR

(71) Applicant: QUALCOMM Incorporated, San Diego, CA (US)

(72) Inventors: Xia Li, San Diego, CA (US); Bin Yang, San Diego, CA (US); Kai Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/154,021

(22) Filed: Oct. 8, 2018

(65) Prior Publication Data
US 2020/0111921 A1    Apr. 9, 2020

(51) Int. Cl.
| | | |
|---|---|---|
| H01L 29/94 | (2006.01) | |
| H01L 27/13 | (2006.01) | |
| H01L 49/02 | (2006.01) | |
| H01L 23/522 | (2006.01) | |
| H01L 29/786 | (2006.01) | |
| H01L 23/00 | (2006.01) | |
| H01L 23/532 | (2006.01) | |

(52) U.S. Cl.
CPC .......... *H01L 29/94* (2013.01); *H01L 23/5223* (2013.01); *H01L 23/5226* (2013.01); *H01L 23/5227* (2013.01); *H01L 23/53295* (2013.01); *H01L 24/16* (2013.01); *H01L 27/13* (2013.01); *H01L 28/10* (2013.01); *H01L 28/60* (2013.01); *H01L 29/7869* (2013.01)

(58) Field of Classification Search
CPC . H01L 29/94; H01L 23/5223; H01L 23/5226; H01L 23/5227; H01L 23/53295; H01L 24/16; H01L 27/13; H01L 28/10; H01L 28/60; H01L 29/7869
See application file for complete search history.

(56) References Cited

U.S. PATENT DOCUMENTS 9,887,300 B2 * 2/2018 Yamazaki ........... H01L 27/1203
9,893,048 B2    2/2018 Lan et al.
(Continued)

OTHER PUBLICATIONS

Kim S., et al., "High-Mobility and Low-Power Thin-Film Transistors Based on Multilayer MoS2 Crystals," Nature Communications, Aug. 21, 2012, pp. 1-7.
(Continued)

*Primary Examiner* — Fernando L Toledo
*Assistant Examiner* — Neil R Prasad
(74) *Attorney, Agent, or Firm* — Patterson & Sheridan, L.L.P.

(57) ABSTRACT

Certain aspects of the present disclosure provide a variable transistor-based capacitive element implemented on a glass or dielectric substrate. Such a variable transistor-based capacitive element may be suitable for use as a tunable capacitor in a passive-on-glass (POG) device, for example. One example device having a tunable capacitance generally includes a glass or dielectric substrate and a transistor disposed above the glass or dielectric substrate. The transistor has a gate region, a drain region, and a source region, wherein a capacitance of the transistor is configured to vary based on a voltage between the gate region and the drain region.

20 Claims, 15 Drawing Sheets

(56) References Cited

U.S. PATENT DOCUMENTS

| | | | | |
|---|---|---|---|---|
| 2015/0130556 A1* | 5/2015 | Bakalski | ............ | H01L 27/0629 |
| | | | | 333/103 |
| 2016/0308073 A1* | 10/2016 | Creed | ............... | H01L 29/66189 |
| 2017/0194245 A1* | 7/2017 | Patil | .................. | H01L 21/76804 |
| 2017/0278874 A1* | 9/2017 | Yamazaki | ........... | H01L 27/1225 |
| 2017/0330977 A1* | 11/2017 | El-Tanani | ............... | H01L 29/94 |

OTHER PUBLICATIONS

Silvaco: "Simulation Standard—a-IGZO TFT Simulation," A Journal for Process and Device Engineers, Jan., Feb., Mar. 2016, vol. 26, No. 1, pp. 1-5.

* cited by examiner

US 10,741,702 B2

THIN-FILM VARIABLE METAL-OXIDE-SEMICONDUCTOR (MOS) CAPACITOR FOR PASSIVE-ON-GLASS (POG) TUNABLE CAPACITOR

TECHNICAL FIELD

Certain aspects of the present disclosure generally relate to electronic circuits and, more particularly, to variable capacitive elements for use in passive-on-glass (POG) devices, for example.

BACKGROUND

A thin-film transistor (TFT) is a special kind of field-effect transistor (FET) made by depositing thin films of an active semiconductor layer, as well as the dielectric layer and metallic contacts, over a supporting, but non-conducting substrate. A common substrate is glass, because the primary application of TFTs is in liquid-crystal displays (LCDs). This differs from conventional transistors, in which the semiconductor material (e.g., silicon) typically is the substrate.

TFTs can be made using a wide variety of semiconductor materials, such as silicon (Si). The characteristics of a silicon-based TFT depend on the silicon's crystalline state; that is, the semiconductor layer can be either amorphous silicon, microcrystalline silicon, or silicon annealed into polysilicon.

Other materials which have been used as semiconductors in TFTs include compound semiconductors, such as cadmium selenide, or metal oxides, such as zinc oxide or hafnium oxide. An application for hafnium oxide is as a high dielectric constant (high-κ) material. TFTs have also been made using organic materials, referred to as organic field-effect transistors (OTFTs).

By using transparent semiconductors and transparent electrodes, such as indium tin oxide (ITO), some TFT devices can be made completely transparent. Such transparent TFTs (TTFTs) can be used for construction of video display panels. Because conventional substrates cannot withstand high annealing temperatures, the deposition process may most likely be completed under relatively low temperatures. Chemical vapor deposition and physical vapor deposition (usually sputtering) may be utilized.

SUMMARY

Certain aspects of the present disclosure generally relate to a variable transistor-based capacitive element implemented on a glass or dielectric substrate. Such a variable transistor-based capacitive element may be suitable for use as a tunable capacitor in a passive-on-glass (POG) device, for example.

Certain aspects of the present disclosure provide a device having a tunable capacitance. The device generally includes a glass or dielectric substrate and a transistor disposed above the glass or dielectric substrate. The transistor has a gate region, a drain region, and a source region, wherein a capacitance of the transistor is configured to vary based on a voltage between the gate region and the drain region.

Certain aspects of the present disclosure are directed to a method for fabricating a device having a tunable capacitance. The method generally includes providing a glass or dielectric substrate and forming a transistor above the glass or dielectric substrate. The transistor has a gate region, a drain region, and a source region, wherein a capacitance of the transistor is configured to vary based on a voltage between the gate region and the drain region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a passive-on-glass (POG) device having a transistor to provide a tunable capacitance.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example POG Device

Figure 1:
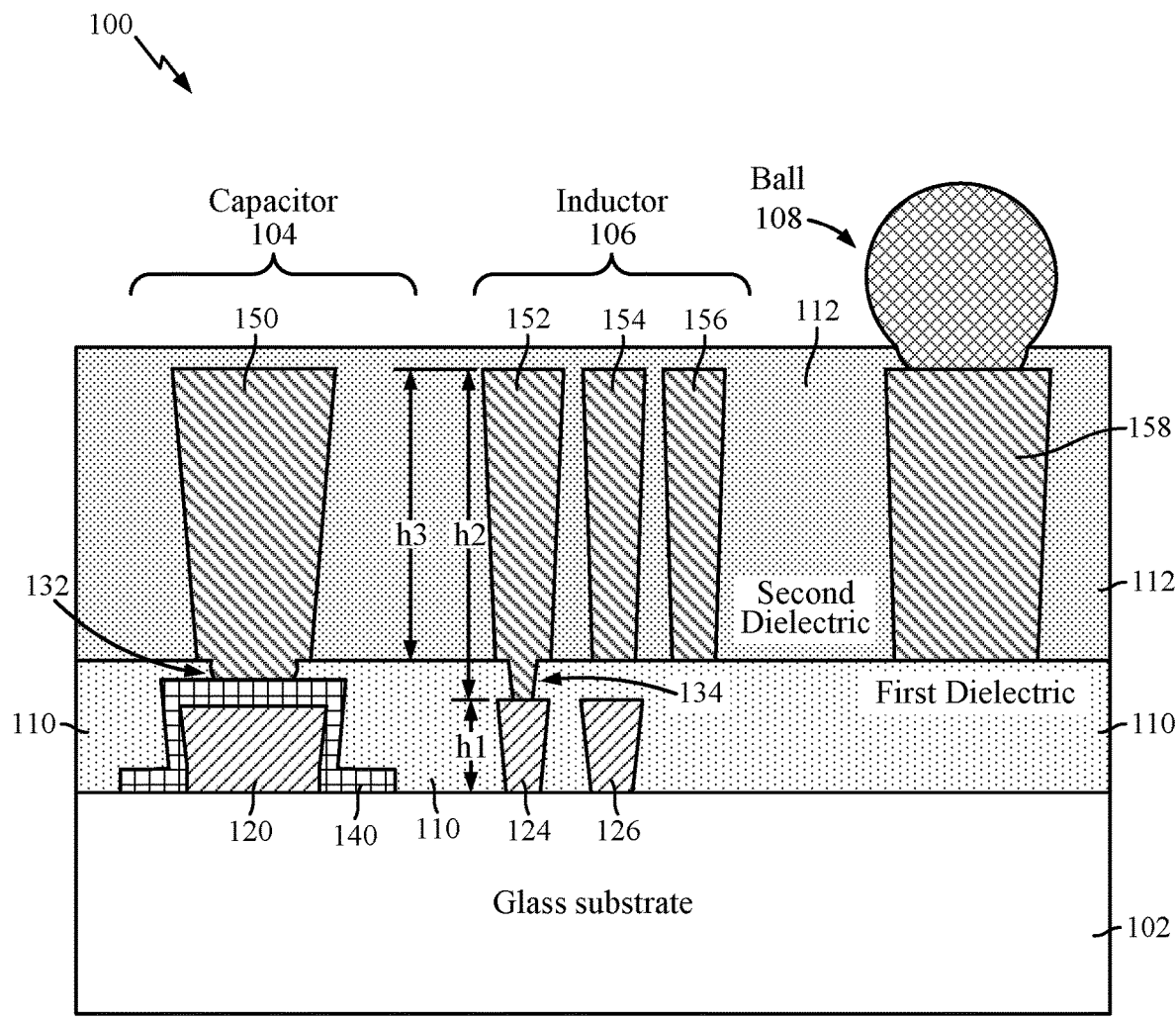
FIG. 1 is a cross-sectional view of an example passive-on-glass (POG) device.

Passive-on-glass (POG) devices include passive components implemented above a glass substrate. Referring to FIG. 1, a first particular illustrative aspect of a device 100 (e.g., an electronic device) that includes a passive device, which may be referred to as a POG device, is shown. Such a device 100 is described in U.S. Pat. No. 9,893,048 to Lan et al., entitled "Passive-on-Glass (POG) Device and Method," issued Feb. 13, 2018, and assigned to Qualcomm, Inc. of San Diego, Calif. As illustrated in FIG. 1, the device 100 is shown as a cross-sectional view. The device 100 may include a glass substrate 102. The passive device may be formed on, in, or through the glass substrate 102. As used herein, "on" may include being in direct contact with and/or being above. The passive device may include an integrated electrical component (e.g., not merely a wire). For example, the passive device may include a capacitor 104, such as a metal-insulator-metal (MIM) capacitor, an inductor 106, or both. The capacitor 104 may be coupled to the inductor 106, and the device 100 may be configured to operate as a radio frequency (RF) resonator or filter, for example. The device 100 (e.g., the passive device) may be included in a wafer (not shown) that includes multiple passive devices.

Although the device 100 is illustrated as including the capacitor 104 and the inductor 106, in other implementations, the device 100 may include the capacitor 104 or the inductor 106. For example, in some implementations, the device 100 may include the capacitor 104 and not the inductor 106.

The device 100 may include a first dielectric layer 110 (e.g., a first inter-layer dielectric (ILD)) and a second dielectric layer 112. A dielectric material of the first dielectric layer 110 and/or the second dielectric layer 112 may include polyimide (PI), benzocyclobuten (BCB), polybenzoxazole (PBO), an acrylic, an epoxy, and/or other materials, as illustrative, non-limiting examples. As an illustrative, non-limiting example, the second dielectric layer 112 may be a PI layer. In some implementations, the first dielectric layer 110 and the second dielectric layer 112 may include different materials. In other implementations, the first dielectric layer 110 and the second dielectric layer 112 may include the same material.

The device 100 may include an M1 layer (e.g., a metal 1 layer) and an M2 layer (e.g., a metal 2 layer). The M1 layer may be associated with first metal structures 120, 124, 126. The M2 layer may be associated with second metal structures 150, 152, 154, 156, 158. Metal structures may include metal islands or metal lines, as an illustrative, non-limiting example.

The capacitor 104 may include metal structures, such as the first metal structure 120 and the second metal structure 150. In some implementations, a first portion 132 of the second metal structure 150 may correspond to a via structure, such as a V1 (e.g., a via 1 layer) of the device 100. The capacitor 104 further includes a dielectric structure 140 (e.g., a dielectric layer). The capacitor 104 may include a first electrode and a second electrode separated by an insulator, such as the dielectric structure 140. The first electrode, such as a bottom electrode, may include or correspond to the first metal structure 120. The second electrode, such as a top electrode, may include or correspond to the second metal structure 150. For example, the second electrode may correspond to the first portion 132 of the second metal structure 150. Although the first portion 132 is illustrated as being part of the second metal structure 150, in other implementations, the first portion 132 may be a via structure that is distinct from the second metal structure 150.

Each of the first metal structure 120 and the second metal structure 150 may include a conductive material, such as copper (Cu), aluminum (Al), and/or aluminum-copper (AlCu), as illustrative, non-limiting examples. In some implementations, the first metal structure 120 and the second metal structure 150 may include different conductive materials. In other implementations, the first metal structure 120 and the second metal structure 150 include the same conductive material. In a particular implementation, the conductive material of the first metal structure 120 and the second metal structure 150 is copper (Cu).

The dielectric structure 140 may include one or more dielectric materials. For example, the dielectric structure 140 may include tantalum pentoxide ($Ta_2O_5$), silicon nitride ($Si_xN_y$), silicon dioxide ($SiO_2$), silicon oxynitride ($SiO_xN_y$), and/or aluminum oxide (e.g., $AlO_x$ and/or $Al_2O_3$), as illustrative, non-limiting examples.

In some implementations, the capacitor 104 may include one or more seed layers (not shown). For example, a first seed layer may be positioned between the glass substrate 102 and the first metal structure 120. The first seed layer may include copper (Cu), titanium (Ti), tungsten (W), or a combination thereof, as illustrative, non-limiting examples. In some implementations, the first seed layer and the first metal structure 120 may include the same material. As another example, a second seed layer may be positioned between the dielectric structure 140 and the second metal structure 150. The second seed layer may include copper (Cu), titanium (Ti), tungsten (W), or a combination thereof, as illustrative, non-limiting examples.

The inductor 106 may include metal structures, such as the first metal structures 124, 126 and second metal structures 152, 154, 156. One or more metal structures of the inductor 106 may include a conductive material, such as copper (Cu), as an illustrative, non-limiting example. The first metal structures 124, 126 may include or correspond to an underpass of the inductor 106 and the second metal structures 152, 154, 156 may include or correspond to a winding of the inductor 106. In some implementations, the inductor 106 may be a spiral inductor.

In some implementations, a portion 134 of the second metal structure 152 may correspond to a via structure, such as a V1 (e.g., a via 1 layer) of the device 100. Although the portion 134 is illustrated as being part of the second metal structure 152, in other implementations, the portion 134 may be a via structure that is distinct from the second metal structure 152.

In some implementations, the inductor 106 may include one or more seed layers (not shown). For example, a first seed layer may be positioned between the glass substrate 102 and each of the first metal structures 124, 126. The first seed layer may include titanium (Ti), copper (Cu), tungsten (W), or a combination thereof, as illustrative, non-limiting examples. In some implementations, the first seed layer and the first metal structures 124, 126 may include the same material. As another example, a second seed layer may be positioned below each of the second metal structures 152, 154, 156. For example, the second seed layer may be positioned between the second metal structure 152 and the first dielectric layer 110 and/or the first metal structure 124. As another example, the second seed layer may be positioned between each of the second metal structures 154, 156 and the first dielectric layer 110. The second seed layer may include copper (Cu), titanium (Ti), tungsten (W), or a combination thereof, as illustrative, non-limiting examples.

The capacitor 104 and/or the inductor 106 may be coupled to the second metal structure 158. The second metal structure 158 may be associated with an input terminal or an output terminal. For example, an end of the second metal structure 158 may be configured as a connection pad and/or may be coupled to a connection pad. The second metal structure 158 may be coupled to a ball 108 (e.g., a solder ball), such as a wafer-level chip scale packaging (WLCSP) ball. The ball 108 may be configured to couple the device 100 to another device or structure, such as a chip. Although the device 100 is illustrated as including the ball 108, in other implementations, the device 100 may not include the ball 108.

During operation of the device 100, one or more electrical charges (e.g., charges provided in response to an alternating current (AC) voltage or a direct current (DC) voltage from a signal/power source) may be applied to the device 100 via the second metal structure 158. For example, a charge may be associated with a radio frequency (RF) signal to be filtered. The charge may be applied to the capacitor 104 and/or the inductor 106. For example, the capacitor 104 and the inductor 106 may be configured as an RF filter. The capacitor 104 and/or the inductor 106 may provide an output via a metal structure (not shown) of the device 100.

In some implementations, a first metal height (h1), such as a M1 layer height, of one or more of the first metal structures 120, 124, 126 may be ≥3 µm. In some implementations, the first metal height (h1) may be ≥5 µm. In other implementations, the first metal height (h1) may be ≥10 µm. By having the first metal height (h1) that is ≥3 µm, the first metal structure 120 of the capacitor 104 may have a reduced resistance as compared to a capacitor having a bottom electrode of aluminum-copper (AlCu) that is less than 3 µm thick formed on a glass substrate. By having a reduced resistance, a performance of the capacitor 104 may be improved as compared to a conventional capacitor with a bottom electrode height of less than 3 µm. Additionally, the first metal height (h1) and/or the first metal structures being copper (Cu) may enable the first metal structures 124, 126 to be used as an underpass of the inductor 106.

In some implementations, a second metal height (h2) of the second metal structure 152 may be ≥10 µm. In some implementations, the second metal height (h2) may be ≥15 µm. In some implementations, the second metal height (h2) may be greater than or equal to 20 µm. In other implementations, the second metal height (h2) may be ≥30 µm. Additionally or alternatively, a third metal height (h3) (e.g., corresponding to a M2 layer height) of a top surface of one or more of the second metal structures 150-158 relative to a surface of the first dielectric layer 110 may be ≥10 µm. In some implementations, the third metal height (h3) may be ≥15 µm. In some implementations, the third metal height (h3) may be ≥20 µm. In other implementations, the third metal height (h3) may be ≥30 µm. The second metal structures 150-158 may be formed as single structures (e.g., not multiple structures stacked one on top of the other), which may enable a single dielectric layer (e.g., the second dielectric layer 112) to be deposited to insulate the second metal structures 150-158. The single dielectric layer (e.g., the second dielectric layer 112) may reduce effects of wafer warpage during manufacturing of the passive device.

One or more passive devices included in the device 100 may have improved performance as compared to conventional passive devices. For example, the capacitor 104 may have a higher quality factor (Q) than a conventional capacitor. To illustrate, the capacitor 104 may have a higher Q resulting from a reduced resistance of the first metal structure 120 due to a thickness (e.g., a height) of the first metal structure as compared to the conventional capacitor. As another example, the conventional capacitor may use a metal structure (e.g., a metal 2 (M2) layer) as the top electrode. A performance of the conventional capacitor may be limited by a contact area between a metal structure (e.g., the metal 2 (M2) layer) and a via structure (e.g., a via 2 (V2) layer that couples the M2 layer to a metal 3 (M3) layer structure, such as a redistribution layer (RDL) structure). By using the first portion 132 of the capacitor 104 as the top electrode, the first portion 132 (e.g., the via structure) may have a larger cross-sectional area (e.g., diameter) and a reduced resistance as compared to the via structure of the conventional capacitor, which may result in higher Q of the capacitor 104 as compared to the conventional capacitor. Additionally, device 100 may be formed using a reduced mask count as compared to conventional methods of forming POG devices, which may reduce a cost of manufacturing and may reduce a manufacturing cycle time.

Example Variable Capacitive Element for POG Device

As described above, passive-on-glass (POG) devices include passive components implemented above a glass substrate. No silicon or other semiconductor material may be available in typical POG devices, and thus, there may be no active components in such POG devices. As such, conventional POG devices may include passive components, such as capacitors, inductors, and/or resistors. Furthermore, the capacitors in conventional POG devices are fixed value capacitors; no tunable capacitor is available in conventional POG devices for such applications as multiple-band radio frequency (RF) re-configuration.

Certain aspects of the present disclosure provide a device with a tunable capacitive element, which is implemented above a glass or dielectric substrate. Thus, the tunable capacitive element may be coupled to one or more passive components implemented in other devices using a glass or dielectric substrate, such as POG devices. Such devices may use an indium gallium zinc oxide (IGZO) thin-film transistor (TFT) or molybdenum disulfide ($MoS_2$) film device to form a tunable metal-oxide semiconductor (MOS) capacitor. This MOS capacitor may be, for example, a P+ gate/P− channel or an N+ gate/N− channel MOS capacitor. As such, the MOS capacitor can be tuned by adjusting a gate voltage to set up the tunable MOS capacitor in the accumulation or reversion region to have relatively larger or smaller capacitance, respectively. The larger capacitance (accumulation) may be accomplished with a high-κ and thin gate dielectric thickness in the MOS capacitor. The smaller capacitance (inversion) may be achieved by a suitable channel dopant concentration in the MOS capacitor. The tunable MOS capacitor may be implemented in parallel or in series with one or more other fixed capacitors to form a tunable capacitance network in the device.

Figure 2A:
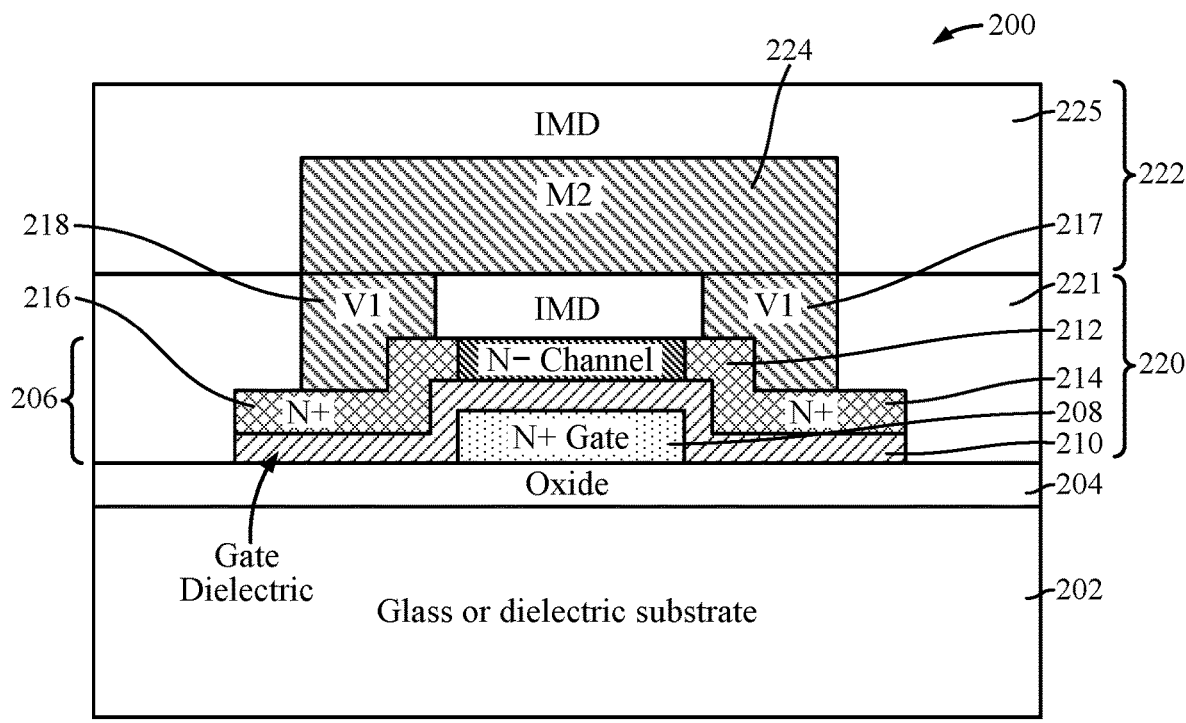
FIG. 2A is a cross-sectional view of an example POG device with a bottom N+ gate/N-well tunable capacitor, in accordance with certain aspects of the present disclosure.

FIG. 2A is a cross-sectional view of an example POG device 200, in accordance with certain aspects of the present disclosure. As used hereinafter, a POG device may refer to any device having one or more passive components disposed above a glass substrate or a dielectric substrate, despite "glass" being in the name "passive-on-glass" device. As illustrated in FIG. 2A, the POG device 200 has a glass or dielectric substrate 202, an oxide layer 204 disposed above the substrate, and a transistor 206 disposed above the oxide layer. In some cases, the substrate 202 may alternatively comprise high resistance silicon (Si).

The transistor 206 may include a bottom N+ gate region 208, a gate dielectric layer 210 disposed above the oxide layer 204 and disposed both above an upper surface and adjacent to lateral surfaces of the gate region 208. The gate dielectric layer 210 may comprise any of various suitable, non-conductive materials, such as silicon nitride ($Si_xN_y$), aluminum oxide ($Al_2O_3$), a high-κ material, zinc oxide ($ZnO_x$), hafnium oxide ($HfO_x$), and the like. The N+ gate region 208 may comprise any of various suitable materials, including aluminum (Al), doped polysilicon, indium tin oxide (ITO), and the like. The transistor 206 also includes an N− doped channel 212 disposed above the gate region 208 and the gate dielectric layer 210. The N− channel 212 may comprise any of various suitable doped materials, such as doped amorphous indium gallium zinc oxide (a-IGZO), $MoS_2$, amorphous silicon (a-Si), or cadmium selenide. The transistor 206 further includes an N+ doped drain region 214 and an N+ doped source region 216, disposed on either side of the N− channel 212 and above the gate dielectric layer 210. Thus, the transistor 206 may be referred to as a bottom N+ gate/N-well transistor, due to the position of the N+ gate region 208 at the bottom of the transistor.

A first via 217 may be disposed above and electrically coupled to the drain region 214, and a second via 218 may be disposed above and electrically coupled to the source region 216. The first and second vias 217, 218 are electrically conductive and may be composed of any suitable material, such as metal. For example, the first and second vias 217, 218 may be composed of copper (Cu), aluminum (Al), or gold (Au).

The transistor 206 and the vias 217, 218 may be disposed in a dielectric layer 220 of the POG device 200. As such, a first dielectric material 221 (e.g., an inter-metallic dielectric (IMD)) may be disposed above the transistor 206 and may surround lateral surfaces of the vias 217, 218, as shown in FIG. 2A. A metal layer 222 may be disposed above the dielectric layer 220. The metal layer 222 may include a trace 224 coupled to the vias 217, 218, which may effectively short the N+ doped drain region 214 to the N+ doped source region 216. A second dielectric material 225 (e.g., IMD) may be disposed above the trace 224.

Figure 2B:
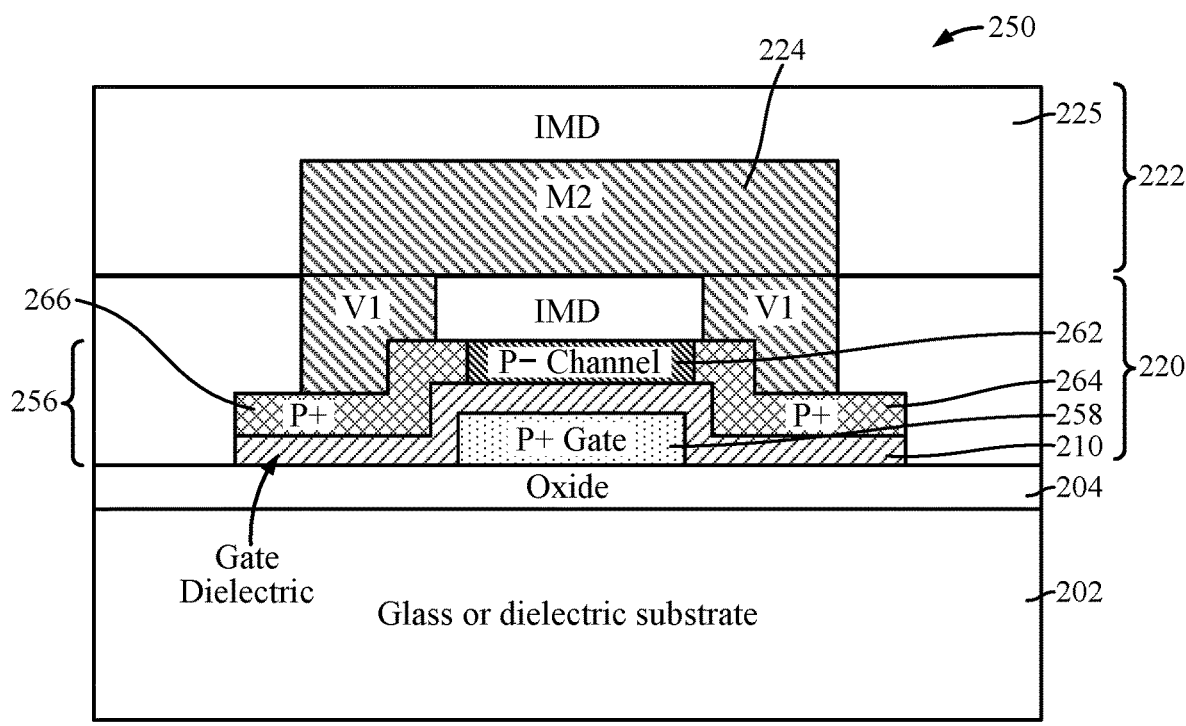
FIG. 2B is a cross-sectional view of an example POG device with a bottom P+ gate/P-well tunable capacitor, in accordance with certain aspects of the present disclosure.

FIG. 2B is a cross-sectional view of another example POG device 250 with a tunable capacitor, in accordance with certain aspects of the present disclosure. The POG device 250 has a glass or dielectric substrate 202, an oxide layer 204 disposed above the substrate, and a transistor 256 disposed above the oxide layer.

The transistor 256 may include a bottom P+ gate region 258, a gate dielectric layer 210 disposed above the oxide layer 204 and disposed both above an upper surface and adjacent to lateral surfaces of the gate region 258. The P+ gate region 258 may comprise any of various suitable materials, including aluminum (Al), doped polysilicon, indium tin oxide (ITO), and the like. The transistor 256 also includes a P− doped channel 262 disposed above the gate region 258 and the gate dielectric layer 210. The P− channel 262 may comprise any of various suitable doped materials, such as doped a-IGZO, $MoS_2$, a-Si, or cadmium selenide. The transistor 256 further includes a P+ doped drain region 264 and a P+ doped source region 266, disposed on either side of the P− channel 262 and above the gate dielectric layer 210. Thus, the transistor 256 may be referred to as a bottom P+ gate/P− well transistor, due to the position of the P+ gate region 258 at the bottom of the transistor.

Figure 3A:
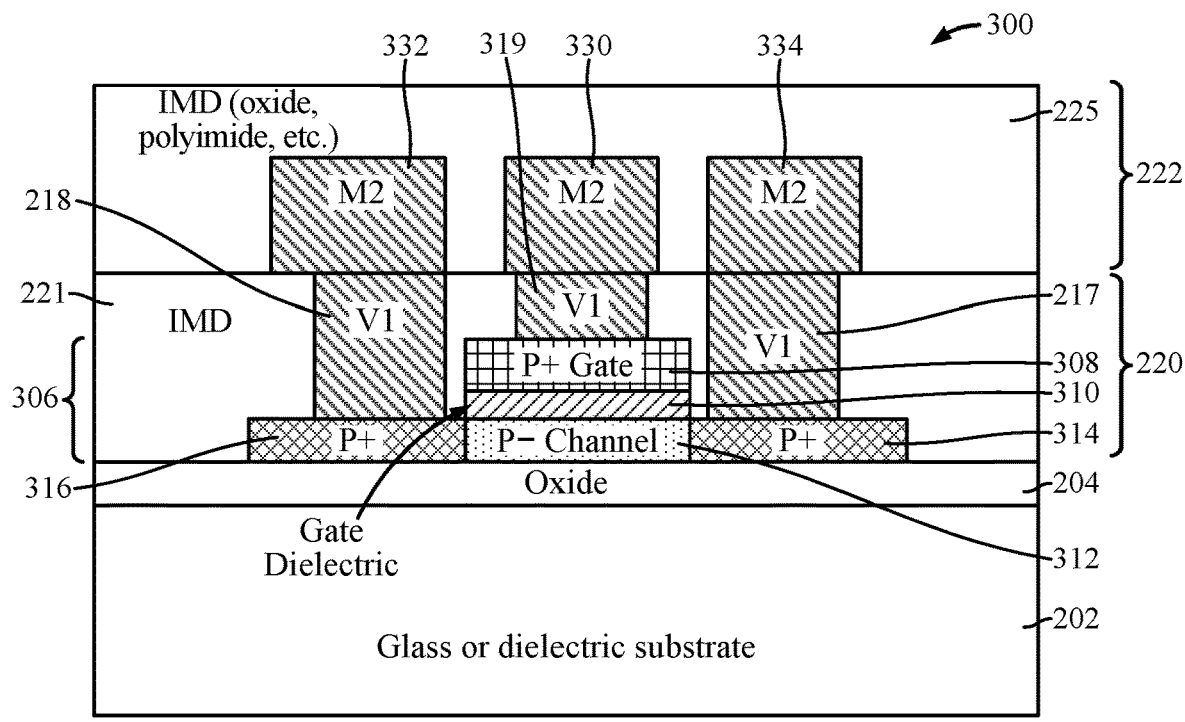
FIG. 3A is a cross-sectional view of an example POG device with a top P+ gate/P-well tunable capacitor, in accordance with certain aspects of the present disclosure.

FIG. 3A is a cross-sectional view of an example POG device 300 with a tunable capacitor, in accordance with certain aspects of the present disclosure. The POG device 300 has a glass or dielectric substrate 202, an oxide layer 204 disposed above the substrate, and a transistor 306 disposed above the oxide layer.

The transistor 306 may include a P− doped channel 312 disposed above the oxide layer 204. The P− channel 312 may comprise any of various suitable doped materials, such as doped amorphous indium gallium zinc oxide (a-IGZO), $MoS_2$, amorphous silicon (a-Si), or cadmium selenide. The transistor 306 also includes a P+ doped drain region 314 and a P+ doped source region 316, disposed on either side of the P− channel 312 and above the oxide layer 204. The transistor 306 further includes a gate dielectric layer 310 disposed above the P− channel 312 and a top P+ gate region 308 disposed above the gate dielectric layer. Thus, the transistor 306 may be referred to as a top P+ gate/P-well transistor, due to the position of the P+ gate region 308 at the top of the transistor. The gate dielectric layer 310 may comprise any of various suitable, non-conductive materials, such as $Si_xN_y$, $Al_2O_3$, a high-κ material, $ZnO_x$, $HfO_x$, and the like. The P+ gate region 308 may comprise any of various suitable materials, including Al, doped polysilicon, ITO, and the like.

A first via 217 may be disposed above and electrically coupled to the drain region 314, a second via 218 may be disposed above and electrically coupled to the source region 316, and a third via 319 may be disposed above and electrically coupled to the gate region 308. The first, second, and third vias 217, 218, 319 are electrically conductive and may be composed of any suitable material, such as metal. For example, the first, second, and third vias 217, 218, 319 may be composed of copper (Cu), aluminum (Al), or gold (Au).

The transistor 306 and the vias 217, 218, 319 may be disposed in a dielectric layer 220 of the POG device 300. As such, a first dielectric material 221 (e.g., IMD) may be disposed above the transistor 306 and may surround lateral surfaces of the vias 217, 218, 319 as shown in FIG. 3A. A metal layer 222 may be disposed above the dielectric layer 220. The metal layer 222 may include a terminal 330 disposed above and electrically coupled to the third via 319, a terminal 332 disposed above and electrically coupled to the second via 218, and a terminal 334 disposed above and electrically coupled to the first via 217. Although not shown in the cross-section of FIG. 3A, terminal 334 may be coupled to terminal 332 to effectively short the P+ doped drain region 314 to the P+ doped source region 316. A second dielectric material 225 (e.g., IMD) may be disposed above the terminals 330, 332, 334.

Figure 3B:
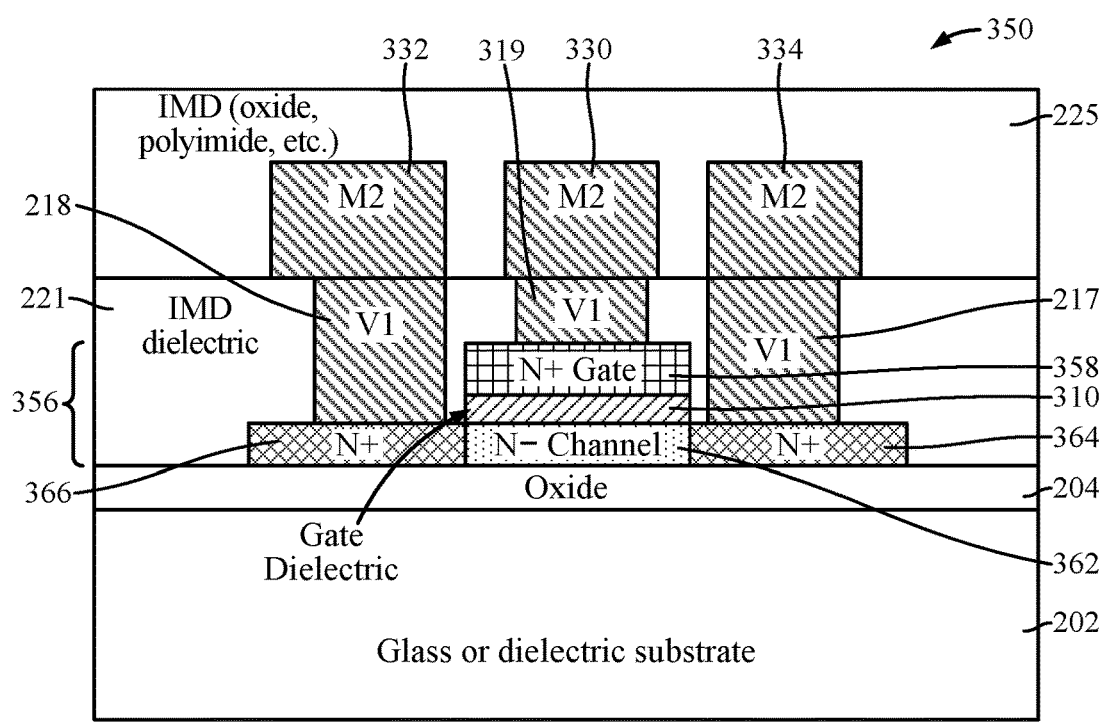
FIG. 3B is a cross-sectional view of an example POG device with a top N+ gate/N-well tunable capacitor, in accordance with certain aspects of the present disclosure.

FIG. 3B is a cross-sectional view of an example POG device 350 with a tunable capacitor, in accordance with certain aspects of the present disclosure. The POG device 350 has a glass or dielectric substrate 202, an oxide layer 204 disposed above the substrate, and a transistor 356 disposed above the oxide layer.

The transistor 356 may include an N− doped channel 362 disposed above the oxide layer 204. The N− channel 362 may comprise any of various suitable doped materials, such as doped a-IGZO, $MoS_2$, a-Si, or cadmium selenide. The transistor 356 also includes an N+ doped drain region 364 and an N+ doped source region 366, disposed on either side of the N− channel 362 and above the oxide layer 204. The transistor 356 further includes a gate dielectric layer 310 disposed above the N− channel 362 and a top N+ gate region 358 disposed above the gate dielectric layer. Thus, the transistor 356 may be referred to as a top N+ gate/N-well transistor, due to the position of the N+ gate region 358 at the top of the transistor. The gate dielectric layer 310 may comprise any of various suitable, non-conductive materials, such as $Si_xN_y$, $Al_2O_3$, a high-κ material, $ZnO_x$, $HfO_x$, and the like. The N+ gate region 358 may comprise any of various suitable materials, including Al, doped polysilicon, ITO, and the like.

Figures 4A, 4B:
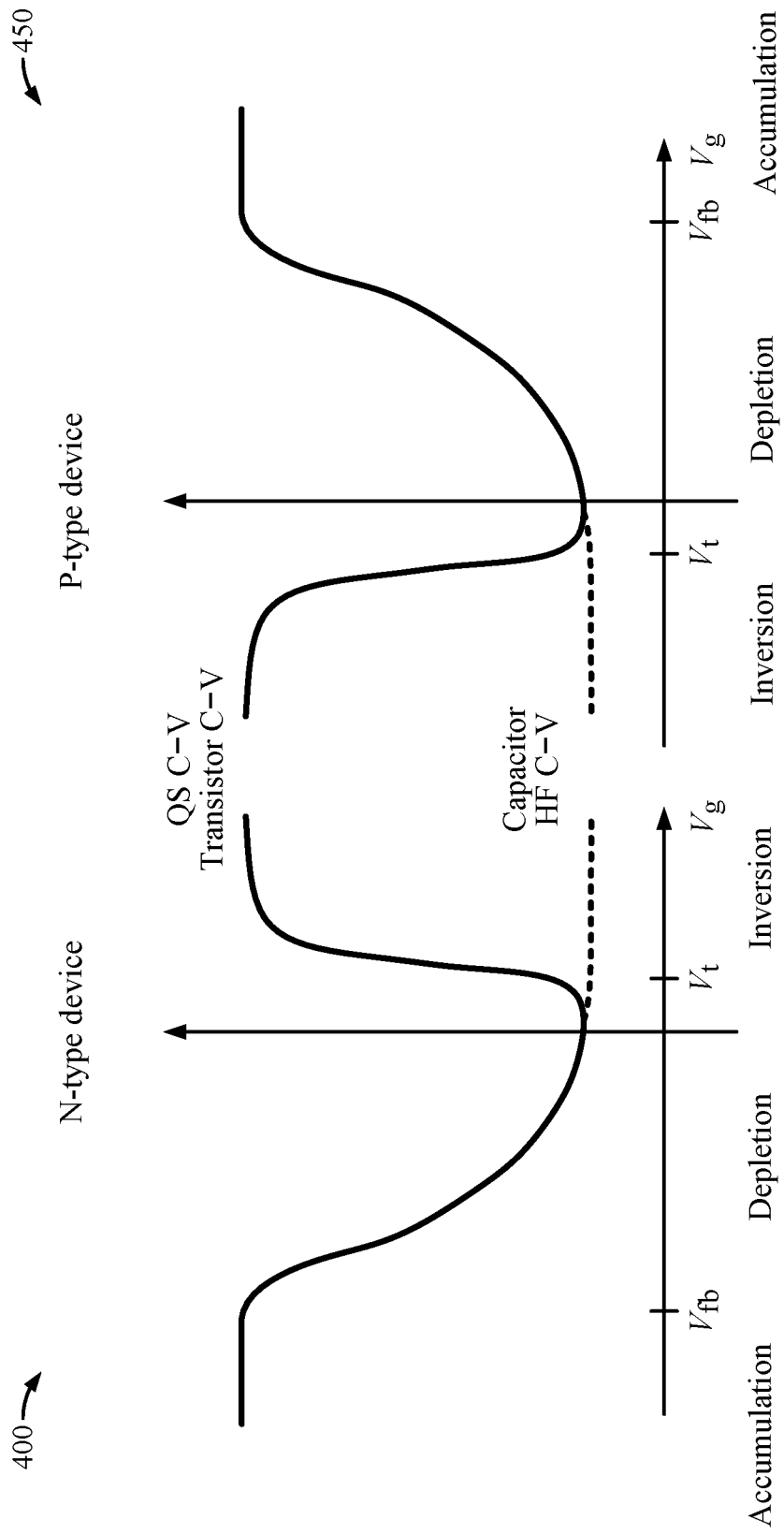
FIG. 4A is a graph of capacitance versus gate voltage for an N-type tunable capacitive device, in accordance with certain aspects of the present disclosure.
FIG. 4B is a graph of capacitance versus gate voltage for a P-type tunable capacitive device, in accordance with certain aspects of the present disclosure.

FIG. 4A is a graph 400 of capacitance versus gate voltage for an N-type tunable capacitive device, such as the transistor 206 of FIG. 2A or the transistor 356 of FIG. 3B, in accordance with certain aspects of the present disclosure. FIG. 4B is a graph 450 of capacitance versus gate voltage for a P-type tunable capacitive device, such as the transistor 256 of FIG. 2B or the transistor 306 of FIG. 3A, in accordance with certain aspects of the present disclosure. As illustrated in the graphs 400 and 450, a MOS capacitor exhibits a step function at depletion and inversion regions for high frequencies (HF C-V). A MOS capacitor recovers its capacitance value in the inversion region for quasi-static (QS C-V) and low frequencies (LF C-V).

FIGS. 5A-5D are schematic diagrams of example capacitive circuits implemented with a tunable capacitive device, in accordance with certain aspects of the present disclosure. The circuits may be implemented in a POG device, where the fixed capacitor is implemented as a passive component and the tunable capacitor is a transistor with a tunable capacitance, such as one of the transistors 206, 256, 306, 356 in FIGS. 2A-3B.

Figure 5A:
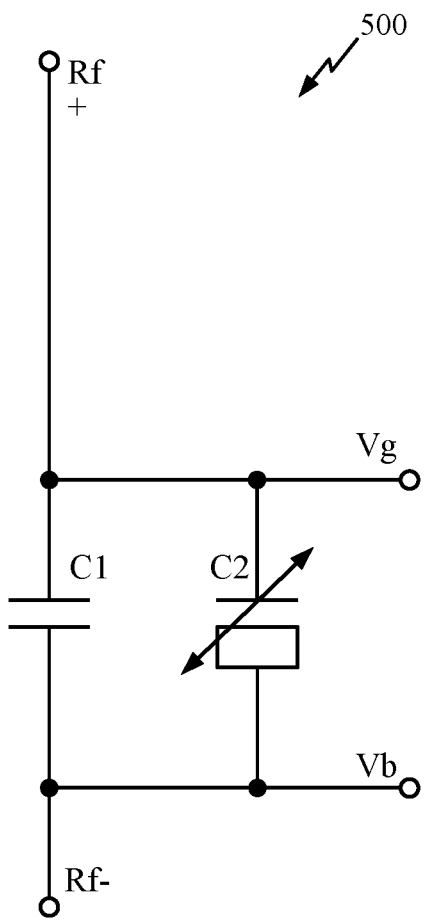
FIGS. 5A-5D are schematic diagrams of example capacitive circuits implemented with a tunable capacitive device, in accordance with certain aspects of the present disclosure.
Figure 5B:
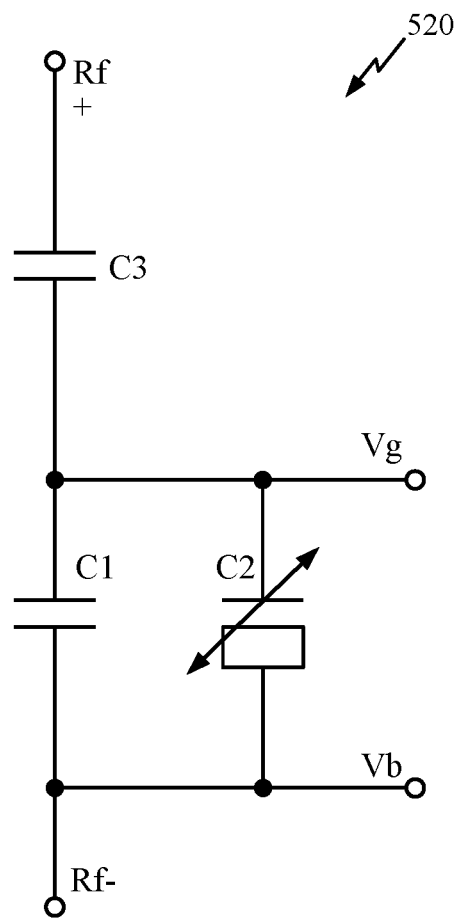
Figures 5C, 5D:
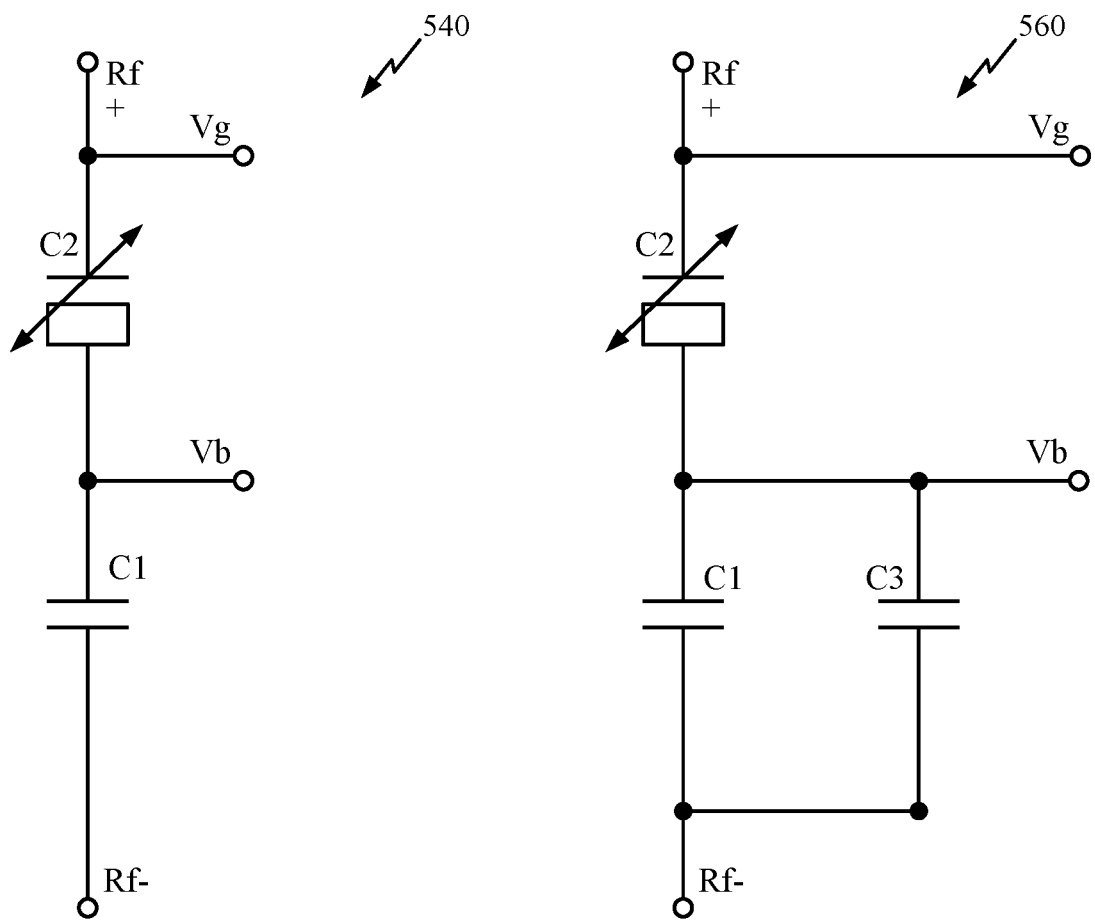

FIG. 5A illustrates a circuit 500 with a fixed capacitor C1 in parallel with a tunable capacitor C2, the parallel combination arranged between differential RF nodes Rf+ and Rf−. The circuit 500 also includes a gate voltage node (Vg) for controlling a gate voltage of the transistor with the tunable capacitance, and bias voltage node (Vb) for connecting a bias voltage to the shorted drain and source regions of the transistor. The fixed capacitor C1 may be a metal-insulator-metal (MIM) capacitor or any other type of suitable capacitor. FIG. 5B illustrates a circuit 520 with a fixed capacitor C3 connected in series with the parallel combination of fixed capacitor C1 and tunable capacitor C2. FIG. 5C illustrates a circuit 540 with a fixed capacitor C1 connected in series with a tunable capacitor C2. FIG. 5D illustrates a circuit 560 with a tunable capacitor C2 connected in series with a parallel combination of fixed capacitors C1 and C3.

Figure 6A:
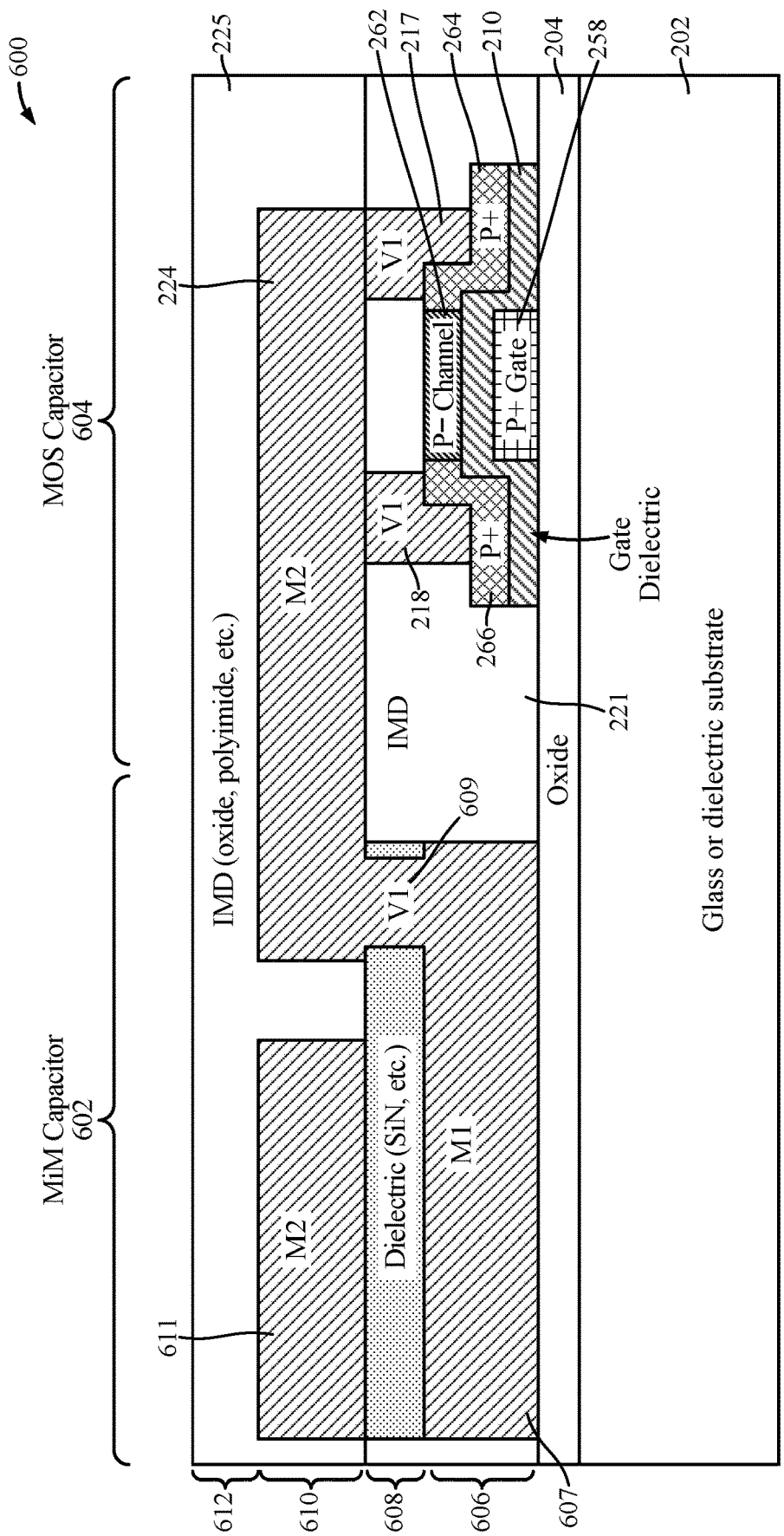
FIG. 6A is a cross-sectional view of an example POG device with a metal-insulator-metal (MIM) capacitor and a bottom P+ gate/P− channel tunable capacitor, in accordance with certain aspects of the present disclosure.

FIG. 6A is a cross-sectional view of an example POG device 600 with a metal-insulator-metal (MIM) capacitor 602 and a metal-oxide-semiconductor (MOS) capacitor 604, in accordance with certain aspects of the present disclosure. The MIM capacitor 602 may be coupled in parallel or in series with the MOS capacitor 604. In FIG. 6A, the MOS capacitor 604 is implemented with a bottom P+ gate/P− channel tunable capacitor, similar to the transistor 256 in the POG device 250 of FIG. 2B and described above.

The MIM capacitor 602 is implemented with a first metal layer 606 (labeled "M1"), a first dielectric layer 608 disposed above the first metal layer, and a second metal layer 610 (labeled "M2") disposed above the first dielectric layer. The MIM capacitor 602 may also include a second dielectric layer 612 disposed above the second metal layer. The first dielectric layer 608 may include any of various suitable dielectric materials, such as silicon nitride ($Si_xN_y$). The metal layers 606 may include any of various suitable metals or alloys, such as copper (Cu), aluminum (Al), or gold (Au). The second dielectric layer 612 may include any of various suitable dielectric materials (e.g., IMD), such as an oxide, polyimide, etc.

The MIM capacitor 602 may be implemented with two sets of opposing, interdigitated fingers in each metal layer, and the metal layers may be stacked (e.g., M2 stacked above M1). For example, a trace 607 in the first metal layer 606 may form one of the fingers, and a trace 611 in the second metal layer 610 may form another one of the fingers in a different layer. A portion of the trace 224 in the second metal layer 610 may form part of an opposing conductor in that layer, the trace 224 being coupled to the trace 607 by a via 609 in the first dielectric layer 608.

Figure 6B:
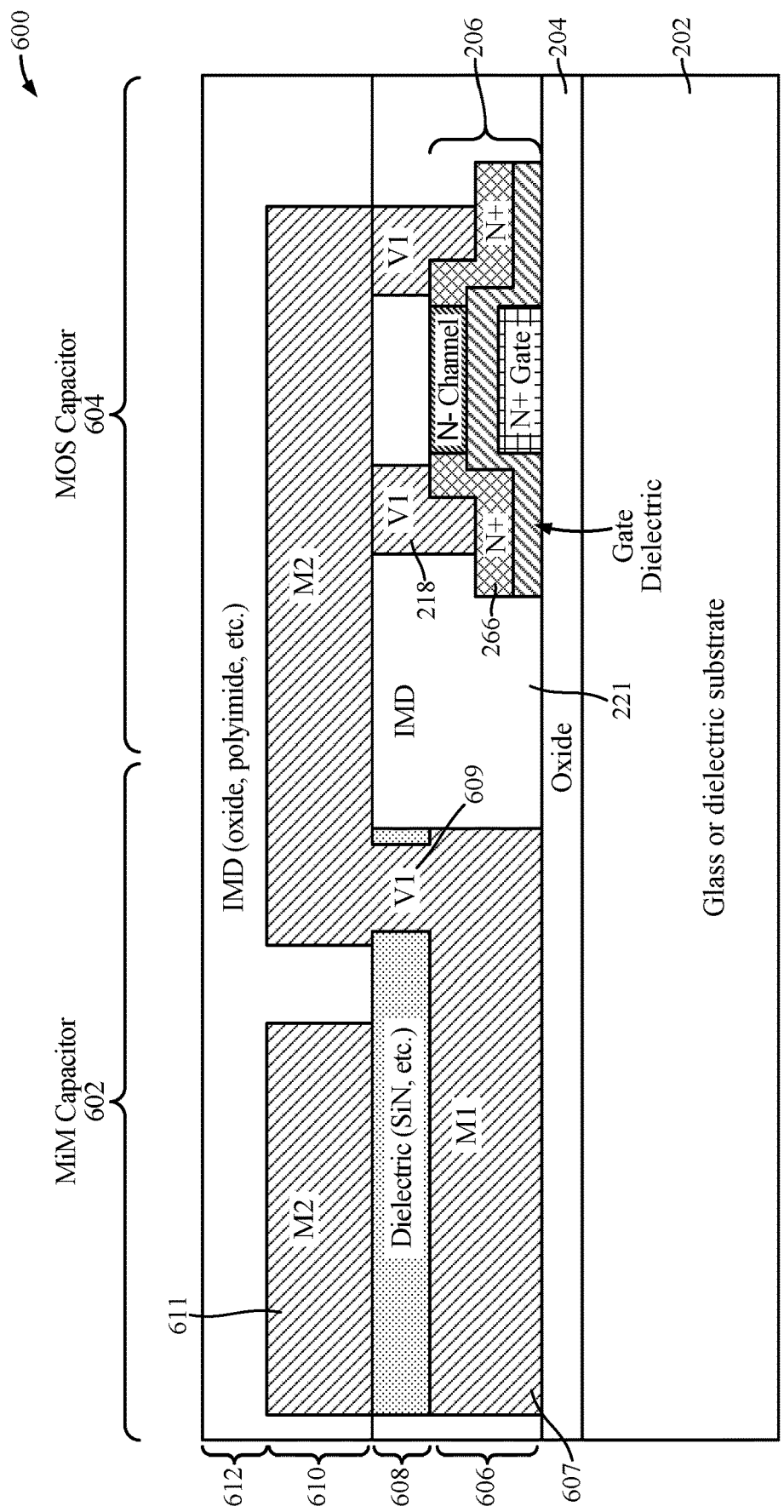
FIG. 6B is a cross-sectional view of an example POG device with a MIM capacitor and a bottom N+ gate/N− channel tunable capacitor, in accordance with certain aspects of the present disclosure.

Although FIG. 6A illustrates the MOS capacitor 604 in the POG device 600 being implemented with a bottom P+ gate/P− channel tunable capacitor, similar to the transistor 256 of FIG. 2B, the MOS capacitor 604 may be implemented with other types of tunable capacitors. For example, FIG. 6B illustrates the MOS capacitor 604 in the POG device 600 being implemented with a bottom N+ gate/N− channel tunable capacitor, similar to the transistor 206 of FIG. 2A and described above.

Figure 6C:
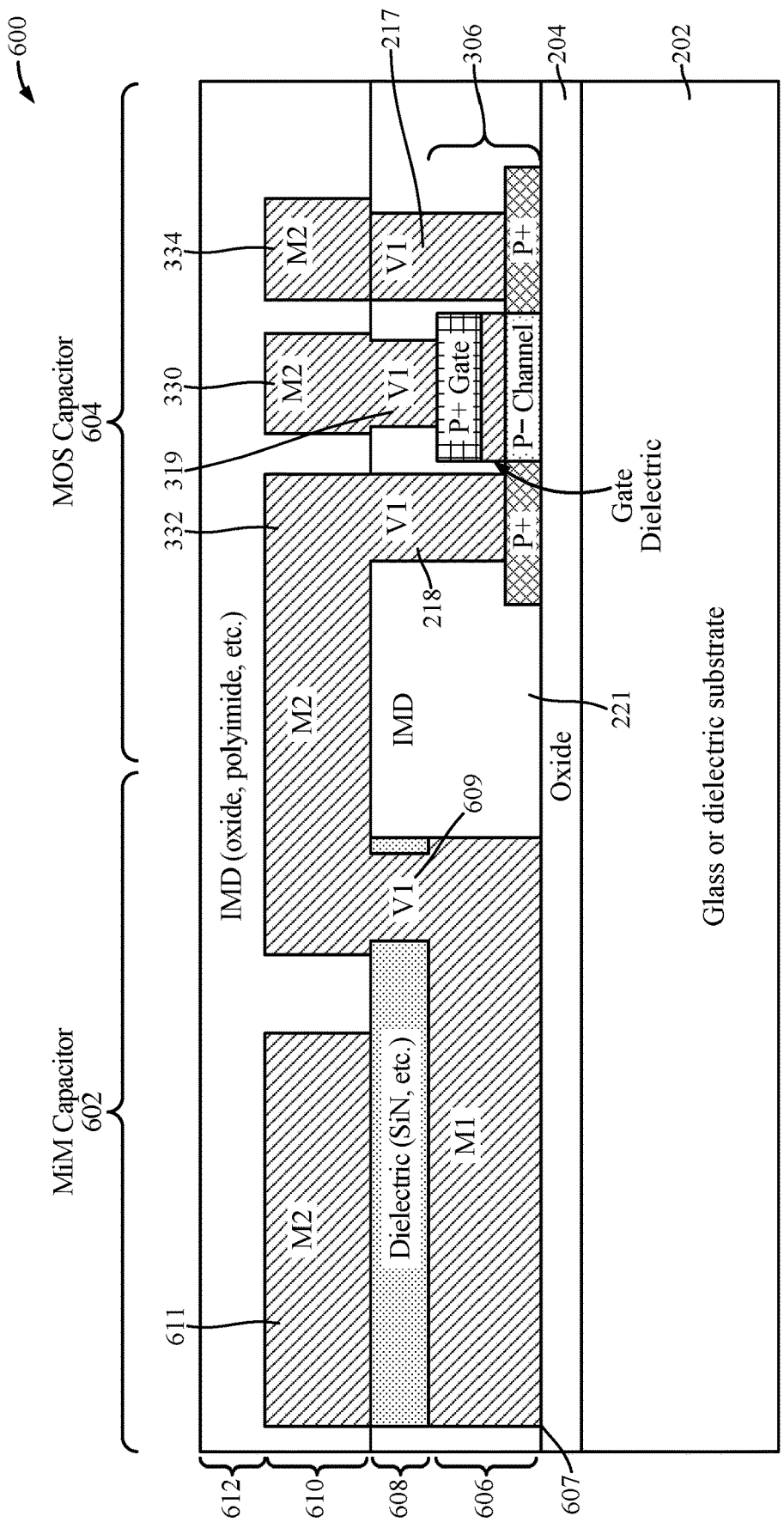
FIG. 6C is a cross-sectional view of an example POG device with a MIM capacitor and a top P+ gate/P− channel tunable capacitor, in accordance with certain aspects of the present disclosure.
Figure 6D:
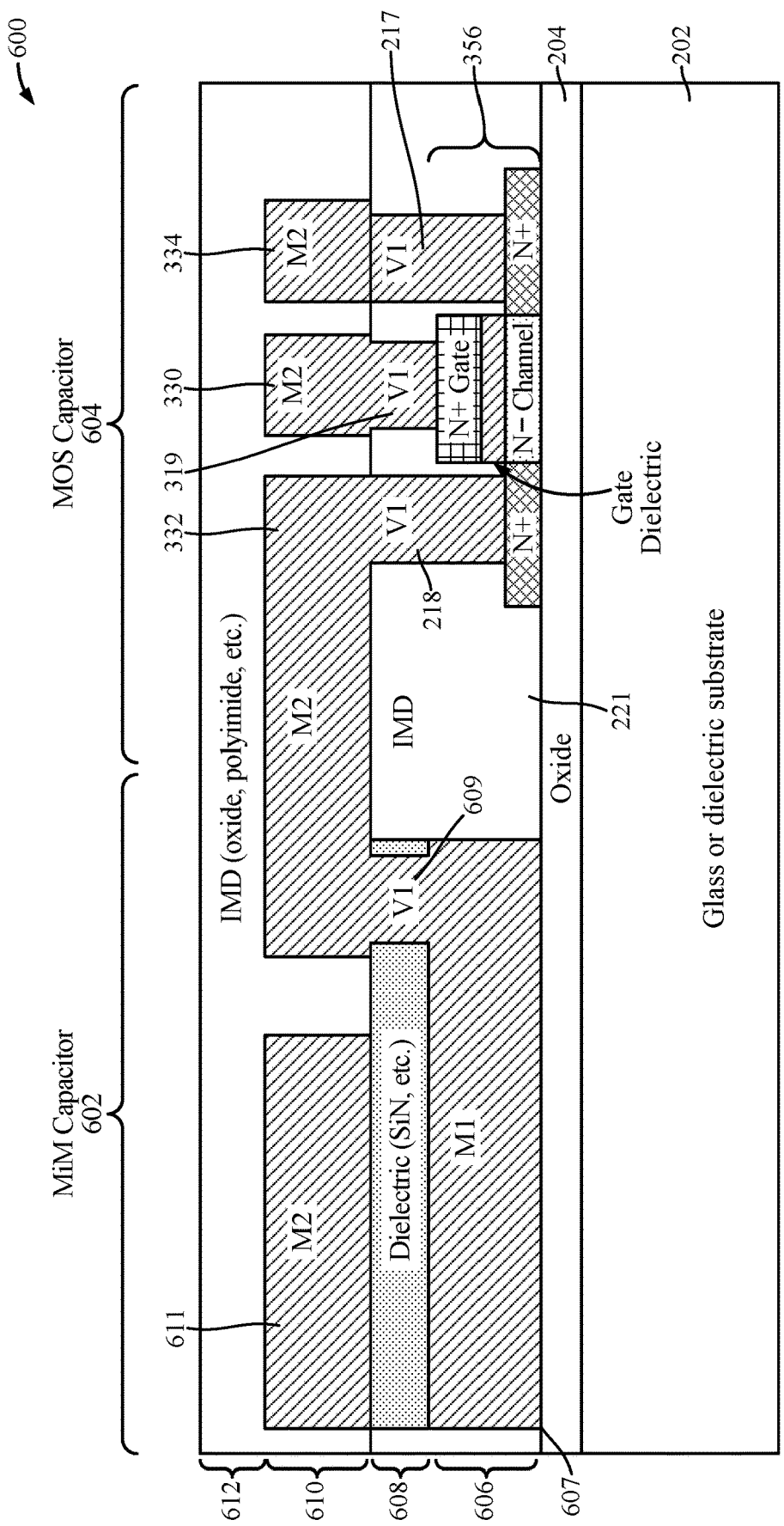
FIG. 6D is a cross-sectional view of an example POG device with a MIM capacitor and a top N+ gate/N− channel tunable capacitor, in accordance with certain aspects of the present disclosure.

Similarly, FIG. 6C illustrates the MOS capacitor 604 in the POG device 600 being implemented with a top P+ gate/P− channel tunable capacitor, similar to the transistor 306 of FIG. 3A and described above. In this case, the terminal 332 may be extended and considered as a trace coupled to the trace 607 by the via 609. FIG. 6D illustrates the MOS capacitor 604 in the POG device 600 being implemented with a top N+ gate/N− channel tunable capacitor, similar to the transistor 356 of FIG. 3B and described above.

Figure 7:
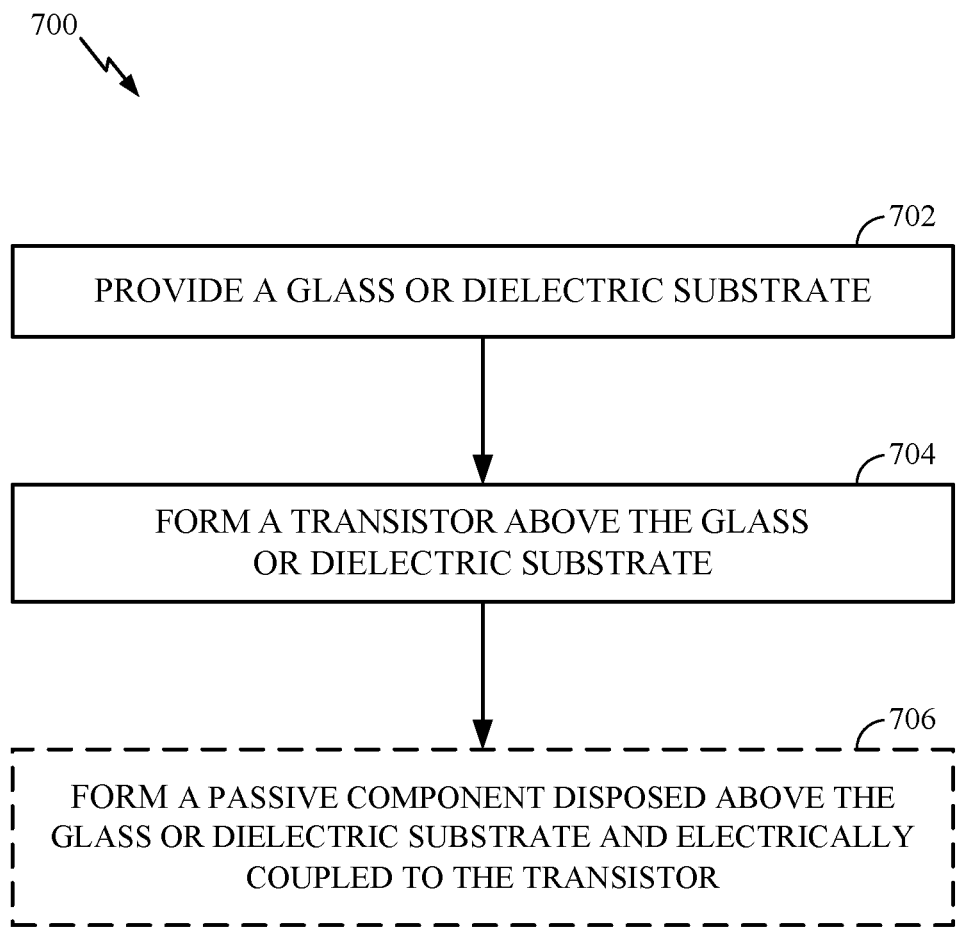
FIG. 7 illustrates example operations for fabricating a device having a tunable capacitance, in accordance with certain aspects of the present disclosure.

FIG. 7 is a flow diagram of example operations 700 for fabricating a device having a tunable capacitance, in accordance with certain aspects of the present disclosure. The device may be a POG device, for example. The operations 700 may be performed, for example, by a semiconductor processing chamber.

The operations 700 may begin, at block 702, by providing a glass or dielectric substrate (e.g., substrate 202). At block 704, a transistor (e.g., transistor 206, 256, 306, 356) may be formed above the glass or dielectric substrate. The transistor has a gate region (e.g., gate region 208, 258, 308, 358), a drain region (e.g., drain region 214, 264, 314, 364), and a source region (e.g., source region 216, 266, 316, 366), and a capacitance of the transistor is configured to vary based on a voltage between the gate region and the drain region.

According to certain aspects, the operations 700 may further entail forming a passive component disposed above the glass or dielectric substrate and electrically coupled to the transistor at optional block 706. For certain aspects, the passive component includes a capacitive element. In this case, the capacitive element may be a metal-insulator-metal (MIM) capacitor (e.g., MIM capacitor 602). For other aspects, the passive component includes an inductive element. The passive component may be coupled in series or in parallel with the transistor.

According to certain aspects, the transistor comprises a metal-oxide-semiconductor field-effect transistor (MOSFET).

According to certain aspects, the transistor is an n-type transistor. In this case, the gate region, the source region, and the drain region may be N+ doped, and a channel between the drain region and the source region may be N− doped.

According to certain aspects, the transistor is a p-type transistor. In this case, the gate region, the source region, and the drain region may be P+ doped, and a channel between the drain region and the source region may be P− doped.

According to certain aspects, the transistor comprises a bottom gate transistor, in which a gate dielectric layer (e.g., gate dielectric layer 210) is disposed above the gate region and in which at least one of the drain region or the source region is disposed above the gate dielectric layer.

According to certain aspects, the transistor comprises a top gate transistor, in which the gate region is disposed above a gate dielectric layer (e.g., gate dielectric layer 310) and in which a channel (e.g., channel 312, 362) between the drain region and the source region is disposed below the gate dielectric layer.

According to certain aspects, the operations 700 further involve forming an oxide layer (e.g., oxide layer 204) disposed between the transistor and the glass or dielectric substrate.

According to certain aspects, the transistor comprises indium gallium zinc oxide (IGZO).

According to certain aspects, the transistor comprises molybdenum disulfide ($MoS_2$).

According to certain aspects, the gate region comprises indium tin oxide (ITO).

FIGS. 8A-8D illustrate example processes to fabricate the POG device 600 of FIG. 6A, in accordance with certain aspects of the present disclosure. Although these processes are illustrated and described herein only for the POG device 600 of FIG. 6A, the reader will understand that similar processes can be followed for fabricating any of the POG devices 600 of FIGS. 6B-6D by making appropriate adjustments and/or substitution of materials thereto.

Figure 8A:
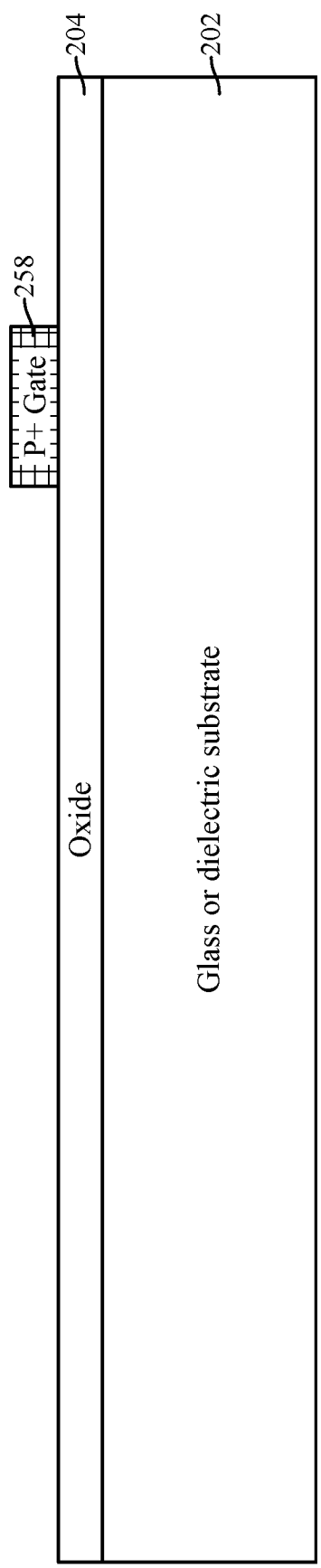
FIGS. 8A-8D illustrate example processes to fabricate the POG device of FIG. 6A, in accordance with certain aspects of the present disclosure.

As illustrated in FIG. 8A, a dielectric film may be deposited above a POG substrate (e.g., the glass or dielectric substrate 202). The dielectric film may comprise an oxide film to form an oxide layer (e.g., the oxide layer 204). The POG substrate may include glass, dielectric, or high resistance silicon (Si). After depositing the dielectric film, a gate material may be deposited above the dielectric film. The gate material may comprise P+ doped polysilicon, aluminum (Al), etc. Then, the deposited gate material may be patterned, to leave a patterned gate (e.g., the P+ gate region 258 as illustrated).

Figure 8B:
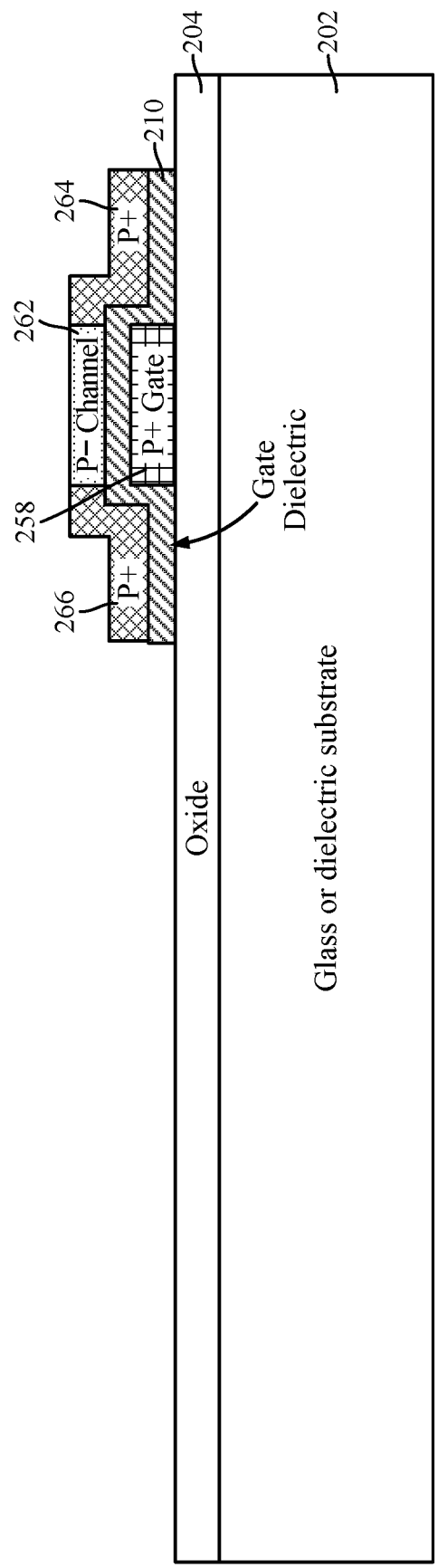

As illustrated in FIG. 8B, a gate dielectric film (e.g., gate dielectric layer 210) may be deposited above the patterned gate. The gate dielectric film may comprise any of various suitable, non-conductive materials, such as silicon nitride ($Si_xN_y$), aluminum oxide ($Al_2O_3$), a high-κ material, zinc oxide ($ZnO_x$), hafnium oxide ($HfO_x$), and the like. After depositing the gate dielectric film, channel material may be deposited (e.g., to form the P− channel 262). The channel material may comprise any of various suitable doped materials, such as P− doped amorphous indium gallium zinc oxide (a-IGZO), $MoS_2$, amorphous silicon (a-Si), or cadmium selenide. The gate dielectric film and channel material may be patterned, and then the P+ contact regions may be P+ doped (e.g., to form the P+ doped drain region 264 and the P+ doped source region 266). A MOS capacitor 604 (e.g., transistor 256) has now been fabricated.

Figure 8C:
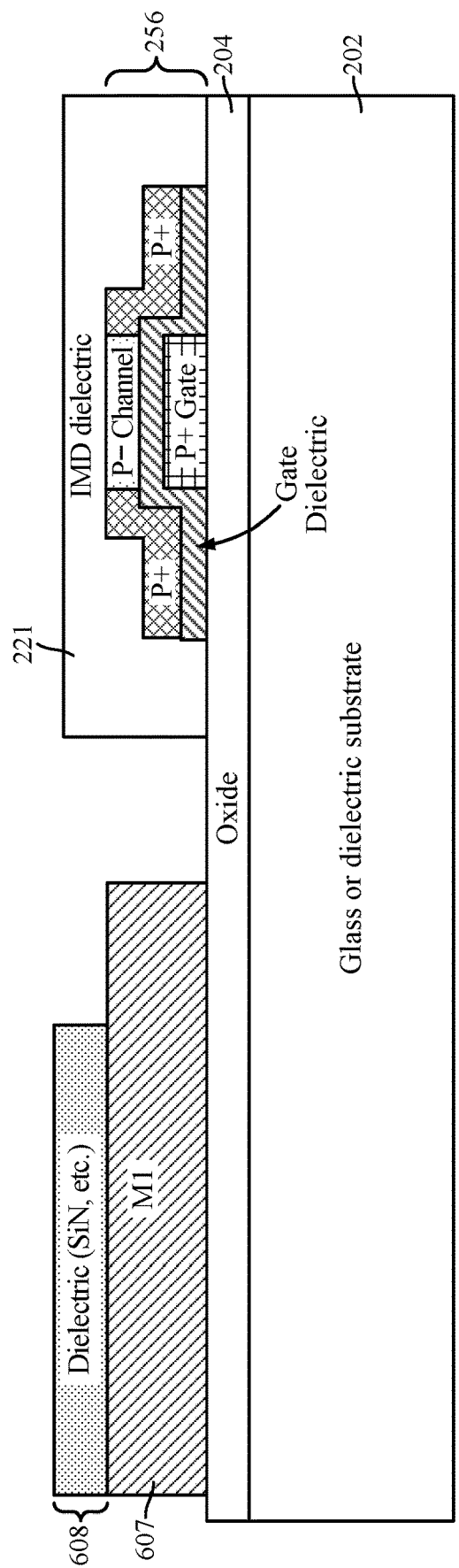

As illustrated in FIG. 8C, a dielectric material (e.g., dielectric material 221), such as an IMD material may be deposited above the transistor 256. The dielectric material may be patterned and may serve to protect the MOS capacitor. A first metal layer (e.g., M1) may be deposited and patterned, for example, to form desired conductive elements (e.g., trace 607). This process may involve a photo-patterning and lifting process, stripping photoresist, and cleaning. A dielectric material (e.g., in dielectric layer 608) may be deposited above the patterned conductive elements of the first metal layer. The dielectric material may include $Si_xN_y$, silicon oxynitride ($SiO_xN_y$), $Al_2O_3$, etc. The dielectric material may then be patterned, for example by a photo and etching process.

Figure 8D:
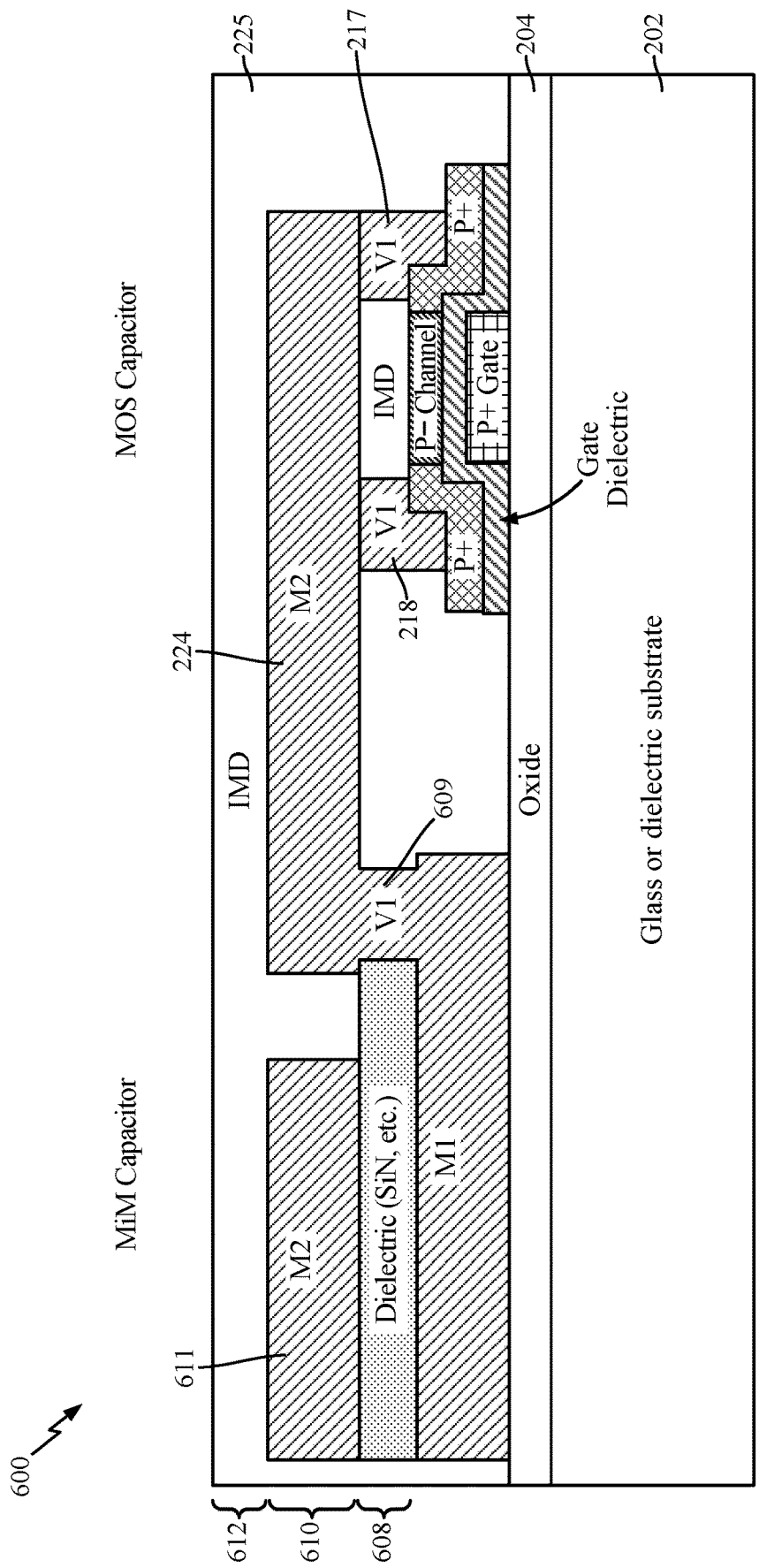

As illustrated in FIG. 8D, additional dielectric material (e.g., material 221) may be deposited. Vias (e.g., vias 217, 218, 609 in a first via layer labeled "V1," which is the same as the first dielectric layer 608) may be added by a photo and etching process in the dielectric material and then depositing the metal for the vias. Then, a second metal layer (M2) may be deposited and patterned, for example, to form desired conductive elements (e.g., traces 224, 611). This process may involve a photo-patterning and lifting process, stripping photoresist, and cleaning. Then, another dielectric material (e.g., IMD) may be deposited above the second metal layer, to cover the second metal layer and complete the fabrication of the POG device 600.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A device having a tunable capacitance, the device comprising:

a glass or dielectric substrate;

a transistor disposed above the glass or dielectric substrate in a first dielectric layer and having a gate region, a drain region, and a source region, wherein a capacitance of the transistor is configured to vary based on a voltage between the gate region and the drain region; and at least one passive component disposed above the glass or dielectric substrate and electrically coupled to the transistor, wherein:
the at least one passive component comprises a metal-insulator-metal (MIM) capacitor;
the MIM capacitor comprises a first electrode disposed in the first dielectric layer, a second electrode disposed in a second dielectric layer disposed above the first dielectric layer, and a dielectric material disposed between the first electrode and the second electrode and in the first dielectric layer; and
the first electrode is coupled to at least one of the source region or the drain region of the transistor.

2. The device of claim 1, wherein the at least one passive component comprises an inductive element.

3. The device of claim 1, wherein the at least one passive component is coupled in series with the transistor.

4. The device of claim 1, wherein the at least one passive component is coupled in parallel with the transistor.

5. The device of claim 1, wherein the transistor comprises a metal-oxide-semiconductor field-effect transistor (MOSFET).

6. The device of claim 1, wherein the transistor is an n-type transistor, wherein the gate region, the source region, and the drain region are N+ doped, and wherein a channel between the drain region and the source region is N− doped.

7. The device of claim 1, wherein the transistor is a p-type transistor, wherein the gate region, the source region, and the drain region are P+ doped, and wherein a channel between the drain region and the source region is P− doped.

8. The device of claim 1, wherein the transistor comprises a bottom gate transistor, in which a gate dielectric layer is disposed above the gate region and in which at least one of the drain region or the source region is disposed above the gate dielectric layer.

9. The device of claim 1, wherein the transistor comprises a top gate transistor, in which the gate region is disposed above a gate dielectric layer and in which a channel between the drain region and the source region is disposed below the gate dielectric layer.

10. The device of claim 1, further comprising an oxide layer disposed between the transistor and the glass or dielectric substrate.

11. The device of claim 1, wherein the transistor comprises indium gallium zinc oxide (IGZO).

12. The device of claim 1, wherein the transistor comprises molybdenum disulfide ($MoS_2$).

13. The device of claim 1, wherein the gate region comprises indium tin oxide (ITO).

14. A method for fabricating a device having a tunable capacitance, the method comprising:
forming a transistor above a glass or dielectric substrate, the transistor having a gate region, a drain region, and a source region, wherein a capacitance of the transistor is configured to vary based on a voltage between the gate region and the drain region; and
forming at least one passive component disposed above the glass or dielectric substrate and electrically coupled to the transistor, wherein:
the at least one passive component comprises a metal-insulator-metal (MIM) capacitor;
the transistor is disposed in a first dielectric layer;
the MIM capacitor comprises a first electrode disposed in the first dielectric layer, a second electrode disposed in a second dielectric layer disposed above the first dielectric layer, and a dielectric material disposed between the first electrode and the second electrode and in the first dielectric layer; and
the first electrode is coupled to at least one of the source region or the drain region of the transistor.

15. The method of claim 14, further comprising forming an oxide layer above the glass or dielectric substrate, wherein forming the transistor comprises forming the transistor above the oxide layer.

16. The method of claim 14, wherein the transistor comprises indium gallium zinc oxide (IGZO).

17. The method of claim 14, wherein the transistor comprises molybdenum disulfide ($MoS_2$).

18. The method of claim 14, wherein the gate region comprises indium tin oxide (ITO).

19. The method of claim 14, wherein the transistor is formed with a gate dielectric layer and wherein the dielectric material in the MIM capacitor is disjoint from the gate dielectric layer in the transistor.

20. The device of claim 1, wherein the transistor further comprises a gate dielectric layer disposed adjacent the gate region and wherein the dielectric material in the MIM capacitor is disjoint from the gate dielectric layer in the transistor.

* * * * *